US009972238B2

(12) United States Patent
Li et al.

(10) Patent No.: US 9,972,238 B2
(45) Date of Patent: May 15, 2018

(54) SHIFT REGISTER AND DRIVING METHOD THEREFOR, GATE DRIVE CIRCUIT AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jinyu Li, Beijing (CN); Xi Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days. days.

(21) Appl. No.: 15/326,846

(22) PCT Filed: Nov. 10, 2015

(86) PCT No.: PCT/CN2015/094182
§ 371 (c)(1),
(2) Date: Jan. 17, 2017

(87) PCT Pub. No.: WO2016/179982
PCT Pub. Date: Nov. 17, 2016

(65) Prior Publication Data
US 2017/0193889 A1    Jul. 6, 2017

(30) Foreign Application Priority Data
May 13, 2015   (CN) .......................... 2015 1 0242821

(51) Int. Cl.
*G09G 3/20* (2006.01)
*G11C 19/28* (2006.01)

(52) U.S. Cl.
CPC ........... *G09G 3/2092* (2013.01); *G11C 19/28* (2013.01); *G09G 2310/0286* (2013.01); *G09G 2310/061* (2013.01)

(58) Field of Classification Search
CPC ... G09G 2310/0286; G09G 2310/0289; G09G 2300/0871; G11C 19/28; G11C 19/00; G11C 19/287; G11C 19/38; G11C 8/10
See application file for complete search history.

(56) References Cited

U.S. PATENT DOCUMENTS

| 2011/0141075 A1* | 6/2011 | Chiang ................. G11C 19/28 345/205 |
| 2014/0056399 A1* | 2/2014 | Shang .................. G11C 19/28 377/68 |

(Continued)

FOREIGN PATENT DOCUMENTS

| CN | 103065578 B | * 12/2012 |
| CN | 103198783 A |   7/2013 |

(Continued)

OTHER PUBLICATIONS

Search Report and Written Opinion dated Feb. 17, 2016 from State Intellectual Property Office of the P.R. China.

*Primary Examiner* — Kent Chang
*Assistant Examiner* — Scott Au
(74) *Attorney, Agent, or Firm* — Dilworth & Barrese, LLP.; Michael J. Musella, Esq.

(57) ABSTRACT

A shift register and a driving method therefor, a gate driving circuit and a display apparatus. The shift register comprises a trigger reset module, a pull-up module, a first capacitor and a pull-down module, and further comprises a denoising module. The pull-up module is used for pulling up a signal output from an output terminal of the shift register and a signal output from a transmission signal output terminal. The pull-down module is used for pulling down a signal (Continued)

output from the output terminal of the shift register and the signal output from the transmission signal output terminal. The denoising module is used for cutting off the connection path between the transmission signal output terminal and a second terminal of the first capacitor in a pull-down phase. The shift register, by providing the denoising module, makes it possible to prevent a coupling effect of the capacitor from making a transmission signal output from the transmission signal output terminal generate a sparkle noise or the like, when a voltage jump occurs at a pull-up node thereof, so that a shift transmission signal of the shift register is more stable, thereby making the signal output from the shift register more stable.

13 Claims, 6 Drawing Sheets

(56) References Cited

U.S. PATENT DOCUMENTS

| 2014/0159997 A1* | 6/2014 | Chen | G09G 3/3611 |
| --- | --- | --- | --- |
|  |  |  | 345/87 |
| 2014/0169518 A1* | 6/2014 | Kong | G09G 3/3674 |
|  |  |  | 377/64 |

FOREIGN PATENT DOCUMENTS

| CN | 103413531 A | 11/2013 |
| --- | --- | --- |
| CN | 103996367 A | 8/2014 |
| CN | 103996370 A | 8/2014 |
| CN | 104810058 A | 7/2015 |

\* cited by examiner

SHIFT REGISTER AND DRIVING METHOD THEREFOR, GATE DRIVE CIRCUIT AND DISPLAY APPARATUS

TECHNICAL FIELD

The present disclosure relates to a field of display technology, and specifically, relates to a shift register and a driving method thereof, a gate driving circuit and a display device.

BACKGROUND

High resolution and narrow bezel have become development trends of a flat panel display technology, and a gate driving circuit integrated into a display panel is a most important solution for realizing display of high resolution and narrow bezel.

The gate driving circuit is formed by cascading multi-stage shift registers sequentially. FIG. 1 is a circuit diagram of a shift register in prior art, and the shift register includes: a trigger transistor T100, a reset transistor T200, a first pull-up transistor T300, a second pull-up transistor T400, a bootstrap capacitor C100 and a pull-down module. The first pull-up transistor T300 is used for pulling up a signal output by an output terminal of the shift register, and the second pull-up transistor T400 is used for pulling up a signal output by a transmission signal output terminal of the shift register. The transmission signal output terminal of the shift register is a cascading terminal for cascading the shift register of a present stage with a shift register of a previous stage and a shift register of a next stage. A first node PU1 is a connecting point between the bootstrap capacitor C100 and a gate electrode of the second pull-up transistor T400. A STV is a start signal input by a start signal terminal connected with a gate electrode of the trigger transistor T100; a RESET is a reset signal input by a reset signal terminal connected with a gate electrode of the reset transistor T200; a CLK is a clock signal input by a clock signal terminal connected with a drain electrode of the second pull-up transistor T400; an OUTPUT is a signal output by an output terminal of the shift register; a VZ is a transmission signal output by the transmission signal output terminal of the shift register; a VGH denotes a voltage of high level; and a VGL denotes a voltage of low level.

As shown in FIG. 2, at a pull-up stage of the shift register, with the STV being at high level (the RESET is at low level) and the trigger transistor T100 being turned on, the bootstrap capacitor C100 is charged by the VGH, and a voltage of the first node PU1 is pulled up to high level; and with the second pull-up transistor T400 being turned on and the CLK being at high level, a signal output by the transmission signal output terminal of the shift register is pulled up, so that a transmission signal of high level is output by the transmission signal output terminal of the shift register. At a pull-down stage of the shift register, with the RESET being at high level (the STV is at low level), high level of the first node PU1 is pulled down to low level by the pull-down module, while the transmission signal output by the transmission signal output terminal of the shift register is pulled down from high level to low level.

In the pull-down stage of the shift register, the voltage of the first node PU1 jumps, that is jumping from high level to low level. A coupling effect of the bootstrap capacitor C100 may directly cause the transmission signal VZ output by the transmission signal output terminal of the shift register to generate a sharp spine, seriously affecting stability of shift transmission of the shift register. Noises of the shift register circuit may be increased by reducing the stability of the shift transmission of the shift register, so that stability of signal output by the output terminal of the shift register is affected.

SUMMARY

The present disclosure provides a shift register and a driving method thereof, a gate driving circuit and a display device for the above said technical problems in the prior art. By arranging a denoising module, the shift register can prevent a transmission signal output by a transmission signal output terminal of the shift register from generating noises such as sharp spines and the like due to a coupling effect of a capacitor when a voltage of a pull-up node jumps, and thus a shift transmission signal of the shift register is more stable, and further a signal output by the shift register is more stable.

The present disclosure provides a shift register, comprising a pull-up module, a first capacitor and a pull-down module, characterized in that, the shift register further comprises a denoising module. A first terminal of the denoising module is connected with a second terminal of the first capacitor, and a second terminal of the denoising module is connected with a transmission signal output terminal. Wherein, the pull-up module is connected with an output terminal of the shift register and the transmission signal output terminal, and connected with a first terminal of the first capacitor, and is used for pulling up a signal output by the output terminal of the shift register and a signal output by the transmission signal output terminal under control of the first terminal of the first capacitor, and a connecting point between the pull-up module and the first terminal of the first capacitor is a pull-up node. The pull-down module is connected with the output terminal of the shift register and the transmission signal output terminal, and connected with the first terminal of the first capacitor, and is used for pulling down the signal output by the output terminal of the shift register and the signal output by the transmission signal output terminal in a pull-down stage The denoising module is used for cutting off a connecting path between the transmission signal output terminal and the second terminal of the first capacitor at the pull-down stage.

Preferably, the denoising module includes a ninth transistor, a gate electrode and a first electrode of the ninth transistor being connected with the second terminal of the first capacitor, and a second electrode of the ninth transistor being connected with the transmission signal output terminal. The ninth transistor is an N-type transistor, a first electrode thereof is a drain electrode, and a second electrode thereof is a source electrode.

Preferably, the denoising module includes a ninth transistor, a first electrode of the ninth transistor being connected with the second terminal of the first capacitor, and a gate electrode and a second electrode of the ninth transistor being connected with the transmission signal output terminal. The ninth transistor is a P-type transistor, a first electrode thereof is a source electrode, and a second electrode thereof is a drain electrode.

Preferably, the pull-up module includes a first sub-module and a second sub-module, the first sub-module and the second sub-module being connected at the pull-up node, the first sub-module being further connected with a first clock signal terminal and the transmission signal output terminal, and the second sub-module being further connected with a first power source and the output terminal of the shift register. The first sub-module is used for pulling up the signal output by the transmission signal output terminal. The second sub-module is used for pulling up the signal output by the output terminal of the shift register.

Preferably, the pull-down module includes a third sub-module and a fourth sub-module, the third sub-module and the fourth sub-module being connected at a pull-down node, the third sub-module being connected with a second clock signal terminal and the first power source, the fourth sub-module being connected with a second power source, the output terminal, the second electrode of the ninth transistor and the transmission signal output terminal, and the fourth sub-module being connected with the first sub-module and the second sub-module in the pull-up node. The third sub-module is used for controlling a potential of the pull-down node in the pull-down stage. The fourth sub-module is used for pulling down the signal output by the output terminal of the shift register and the signal output by the transmission signal output terminal at the pull-down stage.

Preferably, the first sub-module includes a fourth transistor, a gate electrode of the fourth transistor being connected with the pull-up node, a first electrode of the fourth transistor being connected with the first clock signal terminal, and a second electrode of the fourth transistor being connected with the transmission signal output terminal. The second sub-module includes a third transistor, a gate electrode of the third transistor being connected with the pull-up node, a first electrode of the third transistor being connected with the first power source, and a second electrode of the third transistor being connected with the output terminal of the shift register.

Preferably, the third sub-module includes a fifth transistor and a sixth transistor, a gate electrode and a first electrode of the fifth transistor being connected with the second clock signal terminal, and a second electrode of the fifth transistor being connected with a gate electrode of the sixth transistor. A first electrode of the sixth transistor is connected with the first power source and the first electrode of the third transistor, and a second electrode of the sixth transistor is connected with the pull-down node. The fourth sub-module includes a seventh transistor, an eighth transistor, a tenth transistor and an eleventh transistor, a gate electrode of the tenth transistor and a first electrode of the seventh transistor being both connected with the pull-up node. A first electrode of the tenth transistor, a gate electrode of the seventh transistor, a gate electrode of the eighth transistor and a gate electrode of the eleventh transistor are all connected with the pull-down node. A second electrode of the tenth transistor, a second electrode of the seventh transistor, a second electrode of the eighth transistor and a second electrode of the eleventh transistor are all connected with the second power source. A first electrode of the eighth transistor is connected with the second electrode of the ninth transistor, the second electrode of the fourth transistor and the transmission signal output terminal. A first electrode of the eleventh transistor is connected with the second electrode of the third transistor and the output terminal of the shift register.

Preferably, a phase difference between a first clock signal output by the first clock signal terminal and a second clock signal output by the second clock signal terminal is 180 degrees.

Preferably, the shift register further comprises a trigger reset module, for charging and discharging the pull-up node according to a start signal input by a start signal input terminal and a reset signal input by a reset signal input terminal. The trigger reset module includes a trigger sub-module and a reset sub-module, the trigger sub-module and the reset sub-module being connected at the pull-up node, the trigger sub-module being connected with a third power source, and the reset sub-module being connected with a fourth power source. The trigger sub-module is used for charging the pull-up node according to the start signal input by the start signal input terminal. The reset sub-module is used for discharging the pull-up node according to the reset signal input by the reset signal input terminal.

Preferably, the trigger sub-module includes a first transistor, a gate electrode of the first transistor being connected with the start signal input terminal, a first electrode of the first transistor being connected with the third power source, and a second electrode of the first transistor being connected with the pull-up node The reset sub-module includes a second transistor, a gate electrode of the second transistor being connected with the reset signal input terminal, a first electrode of the second transistor being connected with the pull-up node, and a second electrode of the second transistor being connected with the fourth power source.

Preferably, the first to eighth transistors and the tenth and eleventh transistors are N-type transistors, first electrodes thereof are drain electrodes, and second electrodes thereof are source electrodes.

The present disclosure further provides a gate driving circuit, comprising: a multi-stage shift register, the shift register being the shift register described above, and a transmission signal output terminal of the shift register of a present stage is connected with a reset signal input terminal of the shift register of a previous stage and a start signal input terminal of the shift register of a next stage.

The present disclosure further provides a display device, comprising the gate driving circuit described above.

The present disclosure further provides a driving method of a shift register, comprising: a first stage: the first capacitor being charged, the pull-up module pulls up a signal output by an output terminal of the shift register under control of the pull-up node; a second stage: the first capacitor raising a voltage of the pull-up node at the stage, the pull-up module continuously pulls up the signal output by the output terminal of the shift register, and the pull-up module pulls up a signal output by a transmission signal output terminal; and a third stage: the first capacitor being discharged, the pull-up module pulls down the signal output by the output terminal of the shift register and the signal output by the transmission signal output terminal, and the denoising module cuts off a connecting path between the transmission signal output terminal and the second terminal of the first capacitor.

Advantageous effects of the present disclosure: by arranging the denoising module, the shift register and the gate driving circuit provided by the present disclosure can prevent the transmission signal output by the transmission signal output terminal from generating noises such as sharp spines and the like due to a coupling effect of the first capacitor when the voltage of the pull-up node jumps, and thus an interstage shift transmission signal of the shift register is more stable, and meanwhile noises of the shift register circuit is also reduced, and further the signal output by the output terminal of the shift register is more stable.

In the display device provided by the present disclosure, by employing the gate driving circuit described above, the display device displays more stably, and thus display quality of the display device is improved.

BRIEF DESCRIPTION OF THE DRAWINGS

The above and other objectives, features, advantages of the present disclosure will become more apparent from the detailed descriptions of the embodiments of the present disclosure in conjunction with the drawings. The drawings are provided for a further understanding of the present disclosure, and constitute part of the specification; the drawings together with the embodiments of the present disclosure are used to explain the present disclosure, rather than form a limitation thereto. In the drawings, same reference signs generally represent same parts or steps.

DETAILED DESCRIPTION

Figure 1:
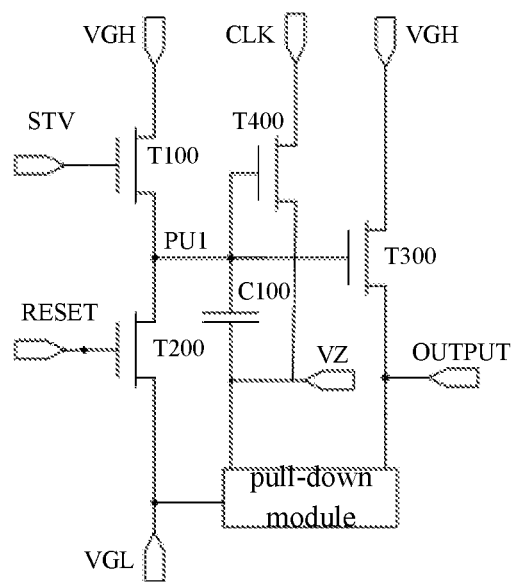
FIG. 1 is a circuit schematic diagram of a shift register in prior art.
Figure 2:
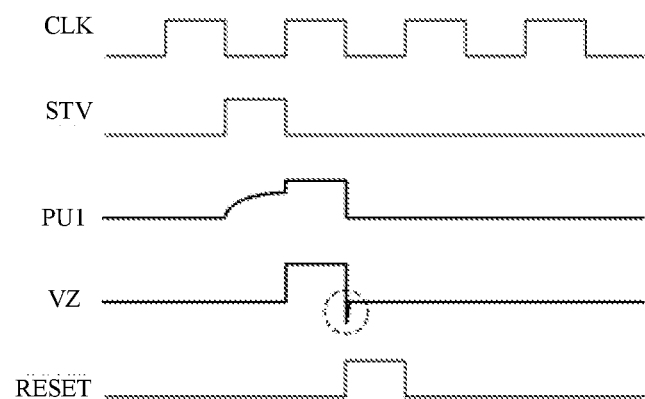
FIG. 2 is a timing diagram of the shift register in FIG. 1.

In order to make the objective, technical solutions, and advantages of the present disclosure clearer, the exemplary embodiments of the present disclosure are described in detail hereinafter in conjunction with the drawings. It is obvious that the described embodiments are just a part but not all of the embodiments of the present disclosure, and those skilled in the art can obtain other embodiment(s), without any inventive work, which should be within the scope of the present disclosure.

Here, it should be noted that in the drawings, the same reference signs are given to composite parts which basically have same or similar structures and functions, and repetitive description about them is omitted.

Hereinafter, a shift register and a driving method thereof, a gate driving circuit and a display device provided by the present disclosure are further described in detail in connecting with the drawings and specific implementation modes.

Embodiment 1

Figure 3:
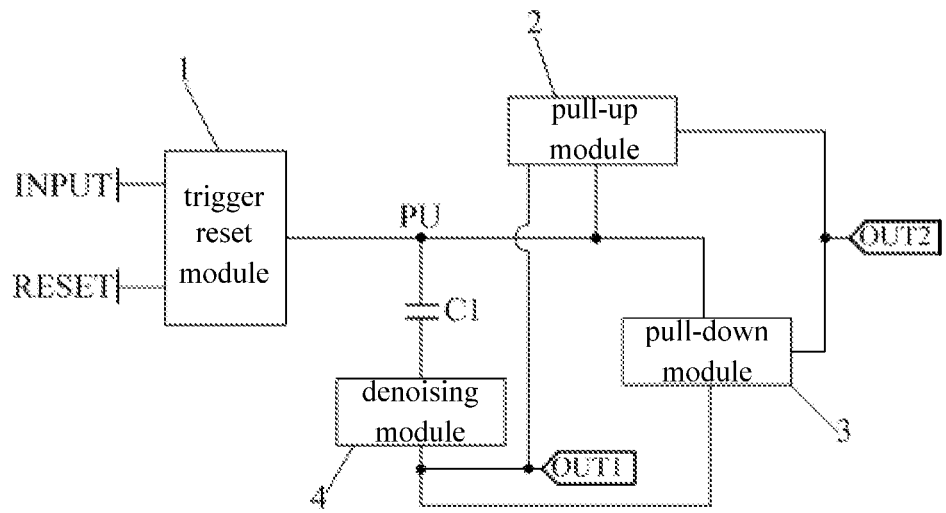
FIG. 3 is a circuit schematic diagram of a shift register in Embodiment 1 of the present disclosure.

The embodiment provides a shift register, as shown in FIG. 3, comprising a trigger reset module 1, a pull-up module 2, a first capacitor C1 and a pull-down module 3, and further comprising a denoising module 4.

As shown in FIG. 3, the trigger reset module 1, the pull-up module 2, the pull-down module 3 and a first terminal of the first capacitor C1 are connected at a pull-up node PU; a first terminal of the denoising module 4 is connected with a second terminal of the first capacitor C1, and a second terminal of the denoising module 4 is connected with the pull-down module 3 and a transmission signal output terminal OUT1; the pull-up module 2 and the pull-down module 3 are both connected with an output terminal OUT2 of the shift register; and the pull-up module 2 and the pull-down module 3 are further connected with the transmission signal output terminal OUT1.

The trigger reset module 1 is used for charging and discharging the pull-up node PU according to a start signal INPUT input by a start signal input terminal and a reset signal RESET input by a reset signal input terminal, so as to trigger or reset the pull-up module 2. The pull-up module 2 is used for pulling up a signal output by the output terminal OUT2 of the shift register and a signal output by the transmission signal output terminal OUT1. The first capacitor C1 is used for raising a voltage of the pull-up node PU at a pull-up stage. The pull-down module 3 is used for pulling down the signal output by the output terminal OUT2 of the shift register and the signal output by the transmission signal output terminal OUT1. The transmission signal output terminal OUT1 is used for outputting an interstage shift transmission signal between a shift register of a present stage and a shift register of a previous stage and a shift register of a next stage. The denoising module 4 is used for denoising the shift transmission signal output by the transmission signal output terminal OUT1 at the pull-down stage.

By arranging the denoising module 4, the shift register can prevent the shift transmission signal output by the transmission signal output terminal OUT1 of the shift register from generating noises such as sharp spines and the like due to a coupling effect of the first capacitor C1 when the voltage of the pull-up node PU jumps, and thus the interstage shift transmission signal of the shift register is more stable, while noises of the shift register circuit is further reduced, and the signal output by the output terminal OUT2 of the shift register is more stable.

Figure 4:
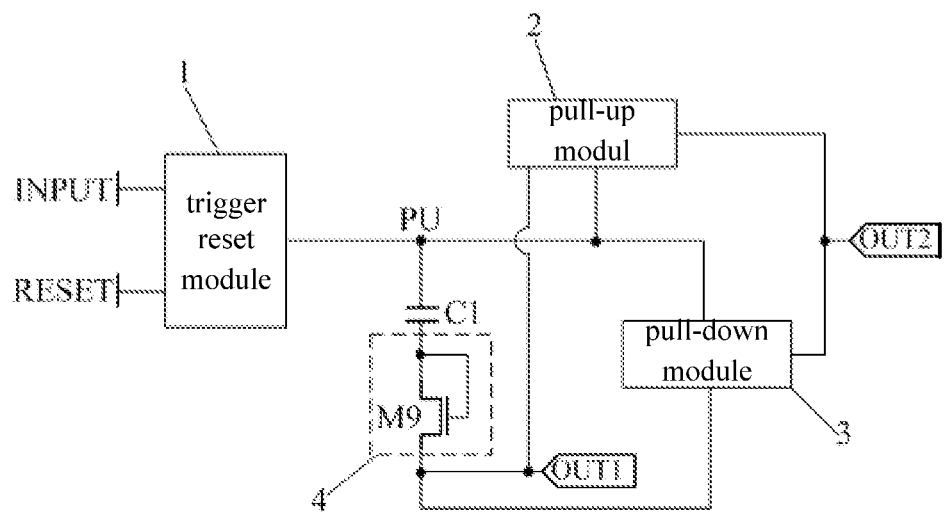
FIG. 4 is a circuit schematic diagram in which a denoising module in FIG. 3 is an N-type transistor.

In the embodiment, as shown in FIG. 4, the denoising module 4 includes a ninth transistor M9, a gate electrode and a first electrode of the ninth transistor M9 are connected with the second terminal of the first capacitor C1, and a second electrode of the ninth transistor M9 is connected with the transmission signal output terminal OUT1 and the pull-down module 3. When the voltage of the pull-up node PU of the first terminal of the first capacitor C1 jumps from high level to low level, the ninth transistor M9 is turned off, so as to cut off a path for transmitting the coupling effect of the first capacitor C1 to the transmission signal output terminal OUT1, further preventing the transmission signal output by the transmission signal output terminal OUT1 from being affected by the coupling effect of the first capacitor C1, ensuring that the transmission signal may not generate noises such as sharp spines and the like, and finally ensuring the stability of the interstage shift transmission signal of the shift register.

Figure 5:
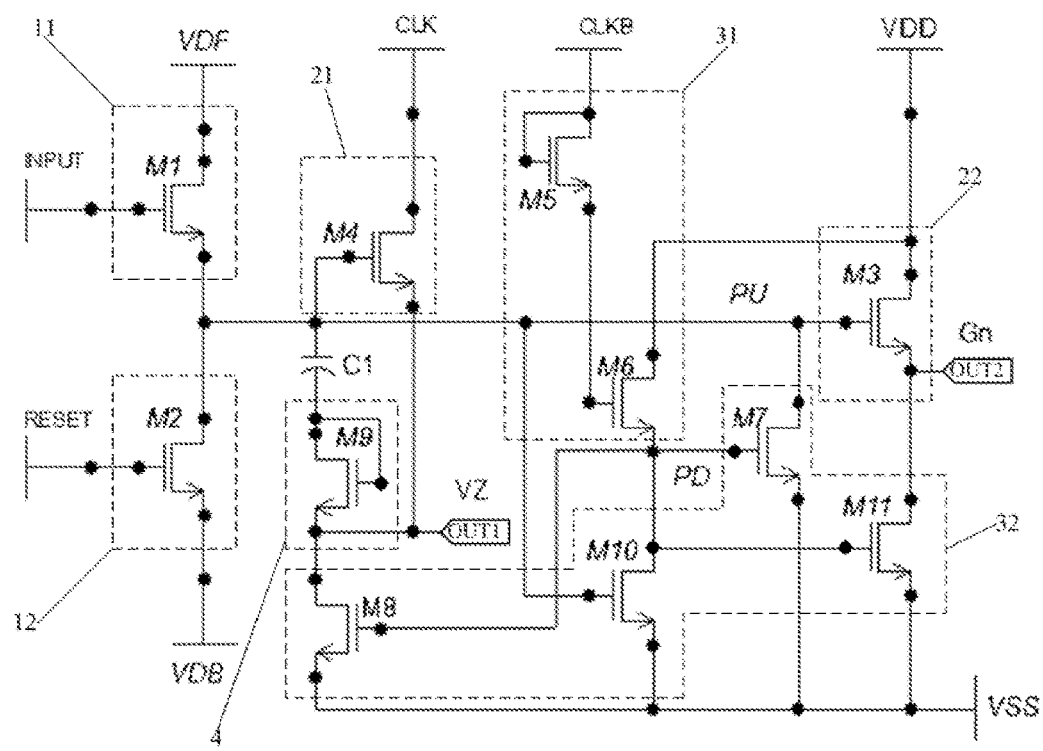
FIG. 5 is a circuit diagram of the shift register in FIG. 3.

In the embodiment, as shown in FIG. 5, the pull-up module 2 includes a first sub-module 21 and a second sub-module 22. The first sub-module 21 and the second sub-module 22 are connected at the pull-up node PU, the first sub-module 21 being further connected with a first clock signal terminal CLK and the transmission signal output terminal OUT1, and the second sub-module 22 being further connected with a first power source VDD and the output terminal OUT 2 of the shift register. The first sub-module 21 is used for pulling up a signal VZ output by the transmission signal output terminal OUT1. The second sub-module 22 is used for pulling up a signal Gn output by the output terminal OUT2 of the shift register.

In the embodiment, the pull-down module 3 includes a third sub-module 31 and a fourth sub-module 32. The third sub-module 31 and the fourth sub-module 32 are connected at a pull-down node PD, the third sub-module 31 being further connected with a second clock signal terminal CLKB and the first power source VDD, the fourth sub-module 32 being further connected with a second power source VSS, the output terminal OUT2, the second electrode of the ninth transistor M9 and the transmission signal output terminal OUT1, and the fourth sub-module 32 is further connected with the first sub-module 21 and the second sub-module 22 in the pull-up node PU. The third sub-module 31 is used for controlling a voltage of the pull-down node PD at the pull-down stage. The fourth sub-module 32 is used for pulling down the signal Gn output by the output terminal OUT2 of the shift register and the signal VZ output by the transmission signal output terminal OUT1.

In the embodiment, the first sub-module 21 includes a fourth transistor M4, a gate electrode of the fourth transistor M4 being connected with the pull-up node PU and the first terminal of the first capacitor C1, a first electrode of the fourth transistor M4 being connected with the first clock signal terminal CLK, and a second electrode of the fourth transistor M4 being connected with the transmission signal output terminal OUT1, the second electrode of the ninth transistor M9 and the fourth sub-module 32. The second sub-module 32 includes a third transistor M3, a gate electrode of the third transistor M3 being connected with the pull-up node PU, a first electrode of the third transistor M3 being connected with the first power source VDD and the third sub-module 31, and a second electrode of the third transistor M3 being connected with the output terminal OUT2 of the shift register and the fourth sub-module 32.

The first power source VDD is a direct current power source. Since the direct current power source controls the third transistor M3 to pull up the signal Gn output by the output terminal OUT2 of the shift register, and as compared with that an alternating current power source is used for controlling the third transistor M3 to pull up the signal Gn output by the output terminal OUT2 of the shift register in the prior art, not only power consumption of the shift register is reduced, but also the signal Gn output by the output terminal OUT2 of the shift register can be prevented from being affected by a coupling effect of the capacitor, that is, the signal Gn output by the output terminal OUT2 of the shift register can be more stable, reducing noises of the shift register.

In the embodiment, the third sub-module 31 includes a fifth transistor M5 and a sixth transistor M6. A gate electrode and a first electrode of the fifth transistor M5 are connected with the second clock signal terminal CLKB, and a second electrode of the fifth transistor M5 is connected with a gate electrode of the sixth transistor M6; and a first electrode of the sixth transistor M6 is connected with the first power source VDD and the first electrode of the third transistor M3, and a second electrode of the sixth transistor M6 is connected with the pull-down node PD.

In the embodiment, the fourth sub-module 32 includes a seventh transistor M7, an eighth transistor M8, a tenth transistor M10 and an eleventh transistor M11. A gate electrode of the tenth transistor M10 and a first electrode of the seventh transistor M7 are both connected with the pull-up node PU; a first electrode of the tenth transistor M10, a gate electrode of the seventh transistor M7, a gate electrode of the eighth transistor M8 and a gate electrode of the eleventh transistor M11 are all connected with the pull-down node PD; a second electrode of the tenth transistor M10, a second electrode of the seventh transistor M7, a second electrode of the eighth transistor M8 and a second electrode of the eleventh transistor M11 are all connected with the second power source VSS; a first electrode of the eighth transistor M8 is connected with the second electrode of the ninth transistor M9, the second electrode of the fourth transistor M4 and the transmission signal output terminal OUT1; and a first electrode of the eleventh transistor M11 is connected with the second electrode of the third transistor M3 and the output terminal OUT2 of the shift register.

The second power source VSS is a direct current power source, and a voltage of the first power source VDD is higher than that of the second power source VSS. The second clock signal and the second power source VSS can jointly control the third sub-module 31 and the fourth sub-module 32 to stably pull down the signal Gn output by the shift register and the transmission signal VZ output by the shift register, so as to effectively reduce noises output by the shift register.

In the embodiment, a first clock signal output by the first clock signal terminal CLK is opposite to a second clock signal output by the second clock signal terminal CLKB, or a phase difference therebetween is 180 degrees.

In the embodiment, the trigger reset module 1 includes a trigger sub-module 11 and a reset sub-module 12. The trigger sub-module 11 and the reset sub-module 12 are connected at the pull-up node PU; the trigger sub-module 11 is connected with a start signal input terminal and a third power source VDF; and the reset sub-module 12 is connected with a reset signal input terminal and a fourth power source VDB. The trigger sub-module 11 is used for triggering the pull-up module 2 according to a start signal INPUT input by the start signal input terminal. The reset sub-module 12 is used for resetting the pull-up module 2 according to a reset signal RESET input by the reset signal input terminal.

In the embodiment, the trigger sub-module 11 includes a first transistor M1, a gate electrode of the first transistor M1 being connected with the start signal input terminal, a first electrode of the first transistor M1 being connected with the third power source VDF, and a second electrode of the first transistor M1 being connected with the pull-up node PU. The reset sub-module 12 includes a second transistor M2, a gate electrode of the second transistor M2 being connected with the reset signal input terminal, a first electrode of the second transistor M2 being connected with the pull-up node PU, and a second electrode of the second transistor M2 being connected with the fourth power source VDB.

In the embodiment, the third power source VDF and the fourth power source VDB are both direct current power sources, and a voltage of the third power source VDF is higher than that of the fourth power source VDB. The start signal INPUT and the third power source VDF can jointly pull up a voltage of the pull-up node PU, to make the output terminal OUT2 of the shift register output the gate driving signal Gn, and to make the transmission signal output terminal OUT1 of the shift register output the transmission signal VZ. The reset signal RESET and the fourth power source VDB can jointly pull down a voltage of the pull-up node PU, to make the output terminal OUT2 of the shift register stop outputting the gate driving signal Gn, and to make the transmission signal output terminal OUT1 of the shift register stop outputting the transmission signal VZ.

Figure 6:
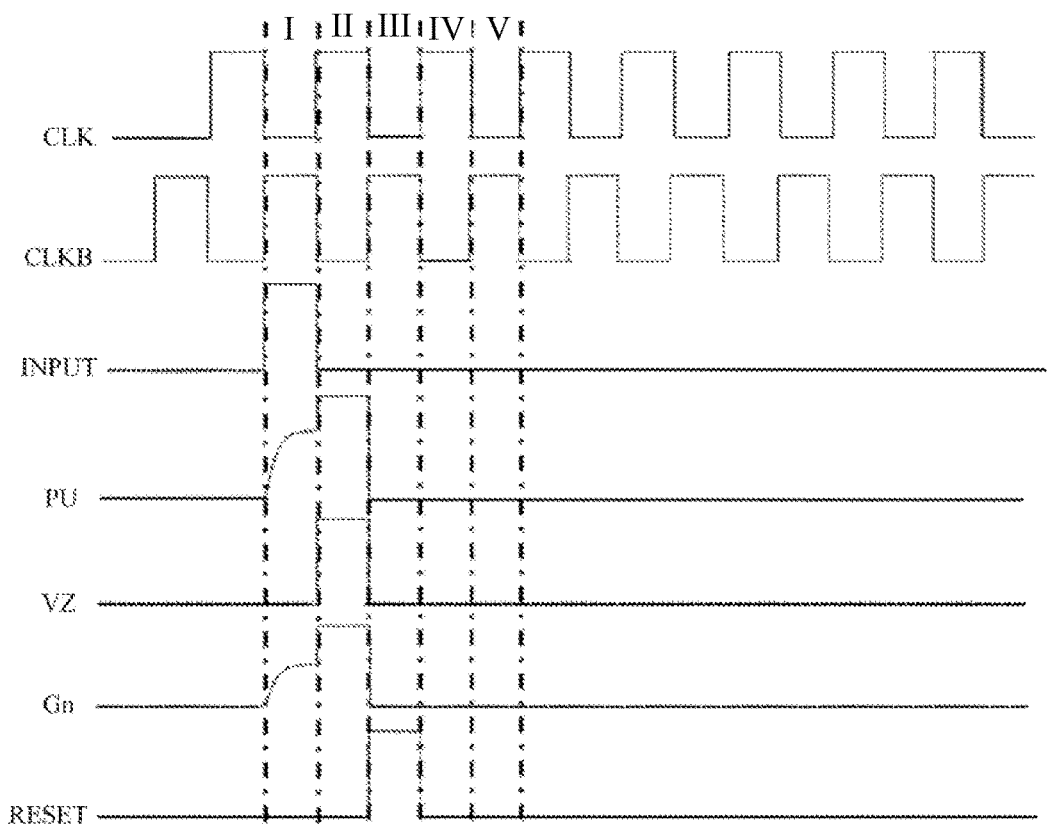
FIG. 6 is a driving timing diagram of the shift register in FIG. 5.

Based on the above structure of the shift register, the embodiment further provides a driving method of the shift register, and the driving method specifically comprises five stages as follows. Hereinafter, respective stages of the driving method of the embodiment will be described with reference to FIG. 6.

A first stage: a trigger reset module 1 triggers a pull-up module 2 according to a start signal INPUT input by a start signal input terminal, and the pull-up module 2 pulls up a signal Gn output by an output terminal OUT2 of the shift register.

At this stage, the start signal INPUT is at high level; a signal output by a first clock signal terminal CLK is at low level; and a signal output by a second clock signal terminal CLKB is at high level.

Specifically, since the start signal INPUT is at high level, the first transistor M1 is turned on to charge the pull-up node PU; with continuous increase of a voltage of the pull-up node PU in a process of charging, the third transistor M3 is half turned on, and the output terminal OUT2 of the shift register has a certain output function, while the fourth transistor M4 is also in a semi-turned on state, and the output terminal OUT1 of the shift register is at low level; and in the process of charging the pull-up node PU, the ninth transistor M9 is turned on. Since the signal output by the second clock signal terminal CLKB is at high level, the fifth transistor M5 and the sixth transistor M6 are turned on to charge the pull-down node PD. In another aspect, since the voltage of the pull-up node PU is continuously increased in the process of charging, the tenth transistor M10 is turned on, and a voltage of the pull-down node PD is pulled down by the second power source VSS. By rationally designing channels of the sixth transistor M6 and the tenth transistor M10, the voltage of the pull-down node PD is pulled down when the sixth transistor M6 and the tenth transistor M10 are turned on at the same time.

At the first stage (i.e., an initial stage of pulling up), the voltage of the pull-down node PD is pulled down, so that the seventh transistor M7, the eighth transistor M8 and the eleventh transistor M11 in the pull-down module 3 are all turned off, that is, the pull-down module 3 does not work at the stage, and thus the signal Gn output by the output terminal OUT2 of the shift register is prevented from being affected by a circuit in the pull-down module 3 at the initial stage of pulling up, and stable output of the output terminal OUT2 of the shift register is further ensured.

A second stage: the first capacitor C1 raises a voltage of the pull-up node PU at the stage; the pull-up module 2 continuously pulls up the signal output by the output terminal OUT2 of the shift register; and meanwhile, the pull-up module 2 pulls up a signal Gn output by a transmission signal output terminal.

At this stage, the start signal INPUT is at low level; a signal output by a first clock signal terminal CLK is at high level; and a signal output by a second clock signal terminal CLKB is at low level.

Specifically, since the voltage of the pull-up node PU is at high level, the fourth transistor M4 is turned on, and since the signal output by the first clock signal terminal CLK is at high level, a transmission signal VZ output by the transmission signal output terminal OUT1 is at high level, and the transmission signal VZ can play a role of performing a shift transmission between a shift register of a present stage and a shift register of a previous stage and a shift register of a next stage. At this time, through a bootstrap effect of the first capacitor C1, a potential of the pull-up node PU is continuously pulled up; the third transistor M3 is fully turned on; and the signal Gn output by the output terminal OUT2 of the shift register is at high level (the output signal Gn of high level provides a gate driving signal for a scanning line in a display device). Meanwhile, the ninth transistor M9 is turned on. And at the same time, the tenth transistor M10 is continuously turned on to maintain the pull-down node PD at low level. Similarly, at the second stage (i.e., a continuously pulling up stage) a level of the pull-down node PD maintains to be pulled down, so that the seventh transistor M7, the eighth transistor M8 and the eleventh transistor M11 in the pull-down module 3 are all turned off, that is, the pull-down module 3 does not work at the stage, and thus the signal Gn output by the output terminal OUT2 of the shift register is prevented from being affected by a circuit in the pull-down module 3 at the initial stage of pulling up, and stable output of the output terminal OUT2 of the shift register is further ensured.

A third stage: the trigger reset module 1 resets the pull-up module 2 according to a reset signal RESET input by a reset signal input terminal, and the pull-up module 3 pulls down the signal Gn output by the output terminal OUT2 of the shift register and the signal VZ output by the transmission signal output terminal OUT1. In addition, at the stage, the denoising module 4 denoises the transmission signal VZ output by the transmission signal output terminal OUT1.

At this stage, the start signal INPUT maintains low level; a signal output by a first clock signal terminal CLK is at low level; a signal output by a second clock signal terminal CLKB is at high level; and the reset signal RESET is at high level.

Specifically, since the reset signal RESET is at high level, the second transistor M2 is turned on, and the voltage of the pull-up node PU is pulled down by the fourth power source VDB, so that the third transistor M3 and the tenth transistor M10 are turned off. Meanwhile, since the signal output by the second clock signal terminal CLKB is at high level, the fifth transistor M5 and the sixth transistor M6 are turned on, and the pull-down node PD changes to high level; and next, the seventh transistor M7, the eighth transistor M8 and the eleventh transistor M11 are turned on; the voltage of the pull-up node PU is further pulled down by the seventh transistor M7, the transmission signal VZ output by the transmission signal output terminal OUT1 is pulled down to low level by the eighth transistor M8, and the signal Gn output by the output terminal OUT2 of the shift register is pulled down to low level by the eleventh transistor M11.

At this stage, when the voltage of the pull-up node PU jumps from high level to low level, a voltage of a first terminal of the first capacitor C1 is reduced, and according to a principle of charging and discharging of a capacitor, a voltage of a second terminal of the first capacitor C1 is also reduced, so that the ninth transistor M9 is turned off; after the ninth transistor M9 is turned off, a path for transmitting a coupling effect of the first capacitor C1 generated when the pull-up node PU jumps to the transmission signal output terminal OUT1 can be cut off, and thus the transmission signal VZ output by the transmission signal output terminal OUT1 is prevented from generating noises such as sharp spines and the like due to the coupling effect of the first capacitor C1, and stability of the shift transmission signal VZ of the shift register is further ensured.

So far, a process of outputting the gate driving signal by the shift register comes to an end. Thereafter, in a process of outputting the gate driving signal by other shift registers except the shift register, it is only necessary to keep the output terminal OUT2 and the transmission signal output terminal OUT1 of the shift register to continuously output a signal of low level. A process of keeping the output terminal OUT2 and the transmission signal output terminal OUT1 of the shift register to continuously output a signal of low level is specifically as follows:

At a fourth stage following the third stage, the start signal INPUT maintains low level; a signal output by a first clock signal terminal CLK is at high level; a signal output by a second clock signal terminal CLKB is at low level; and the reset signal RESET is at low level.

At the fourth stage, since a gate electrode of the fifth transistor M5 is connected with a first electrode thereof, the fifth transistor M5 has a latching function, and the sixth transistor M6 is turned on. At this time, the pull-down node PD is still at high level, the seventh transistor M7, and the eighth transistor M8 and the eleventh transistor M11 are turned on, so that both the signal Gn output by the output terminal OUT2 of the shift register and the transmission signal VZ output by the transmission signal output terminal OUT1 are maintained at low level.

At a fifth stage, the start signal INPUT maintains low level; a signal output by a first clock signal terminal CLK is at low level; a signal output by a second clock signal terminal CLKB is at high level; and the reset signal RESET is at low level. Since the signal output by the second clock signal terminal CLKB is at high level, the fifth transistor M5 and the sixth transistor M6 are turned on; the pull-down node PD is at high level, the seventh transistor M7, the eighth transistor M8 and the eleventh transistor M11 are turned on, so that both the signal Gn output by the output terminal OUT2 of the shift register and the transmission signal VZ output by the transmission signal output terminal OUT1 are maintained at low level.

At the fourth stage and the fifth stage, the second clock signal and the first power source VDD can jointly control the shift register to obtain more stable pull-down control signal, so as to effectively reduce noises output by the shift register.

Thereafter, the shift register of the embodiment repeats operations in the fourth stage and the fifth stage till the start signal terminal inputs the start signal INPUT again.

The shift register completes a shift register function by completing the above stages sequentially, so that the shift register can provide more stable output signal Gn and transmission signal VZ.

It should be noted that, in the embodiment, a voltage of the third power source VDF may be also less than that of the fourth power source VDB. At this time, the reset signal input terminal inputs the start signal INPUT, and the start signal input terminal inputs the reset signal RESET, so that a reverse scanning of a cascaded shift register circuit can be realized, that is, the cascaded shift register circuit is scanned from last row (i.e., an ending row) of a display panel to a first row (i.e., a beginning row).

Embodiment 2

Figure 7:
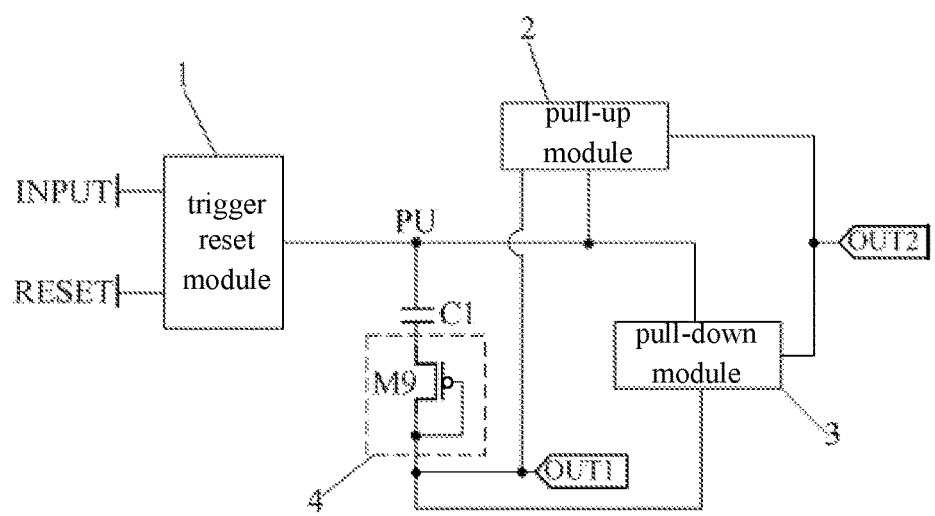
FIG. 7 is a circuit schematic diagram in which a denoising module in Embodiment 2 of the present disclosure is a P-type transistor.
Figure 8:
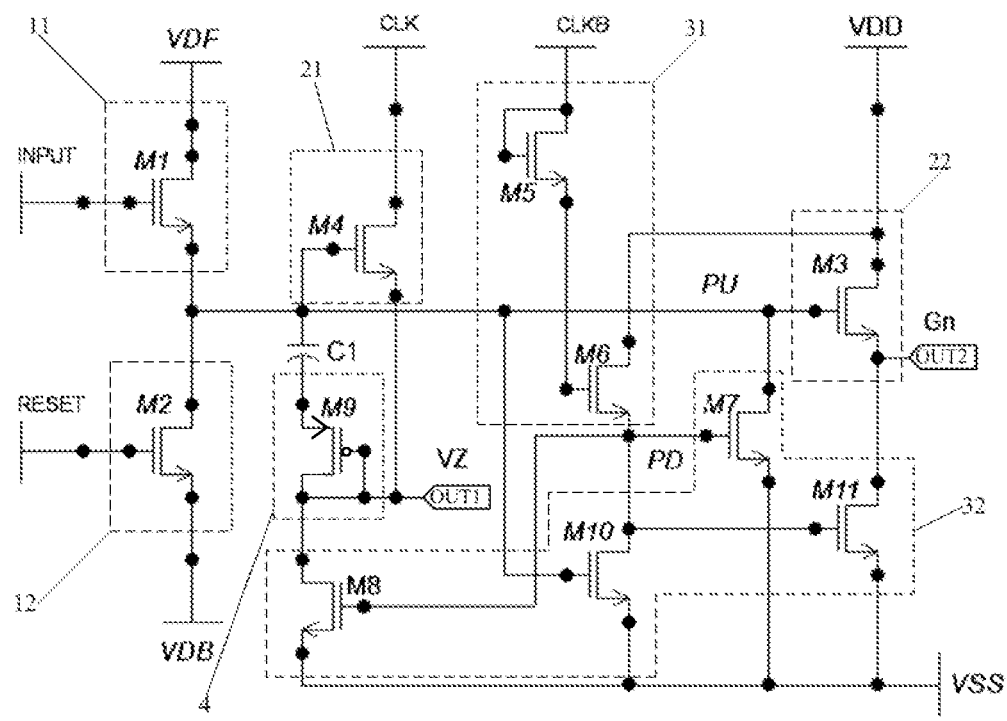
FIG. 8 is a circuit diagram of a shift register in Embodiment 2 of the present disclosure.

The embodiment provides a shift register, which is different from Embodiment 1 in that, as shown in FIG. 7 and FIG. 8, the denoising module 4 includes a ninth transistor M9, a first electrode of the ninth transistor M9 being connected with a second terminal of the first capacitor C1, and a gate electrode and a second electrode of the ninth transistor M9 being connected with the transmission signal output terminal OUT1 and a pull-down module 3.

When a voltage of the transmission signal output terminal OUT1 jumps from high level to low level, the ninth transistor M9 is turned off, so as to cut off a path for transmitting a coupling effect of the first capacitor C1 to the transmission signal output terminal OUT1, further preventing the transmission signal output by the transmission signal output terminal OUT1 from being affected by the coupling effect of the first capacitor C1, ensuring that the transmission signal may not generate noises such as sharp spines and the like, and finally ensuring the stability of an interstage shift transmission signal of the shift register.

Other structures and driving methods of the shifter register in the embodiment are same as those of Embodiment 1, which will not be repeated here.

The denoising module 4 of the shift register in the embodiment also denoises a transmission signal VZ output by the transmission signal output terminal OUT1 at the third stage of the driving method, but its specific denoising process is different from that of Embodiment 1. Hereinafter, the denoising process of the denoising module 4 in the embodiment is specifically described based on the above circuit connection of the denoising module 4 in the embodiment.

At the third stage, the start signal INPUT maintains low level; a signal output by a first clock signal terminal CLK is at low level; a signal output by a second clock signal terminal CLKB is at high level; and the reset signal RESET is at high level.

Specifically, since the reset signal RESET is at high level, the second transistor M2 is turned on, and the voltage of the pull-up node PU is pulled down by the fourth power source VDB, so that the third transistor M3 and the tenth transistor M10 are turned off. Meanwhile, since the signal output by the second clock signal terminal CLKB is at high level, the fifth transistor M5 and the sixth transistor M6 are turned on, and the pull-down node PD changes to high level; and next, the seventh transistor M7, the eighth transistor M8 and the eleventh transistor M11 are turned on; the voltage of the pull-up node PU is further pulled down by the seventh transistor M7, and the transmission signal VZ output by the transmission signal output terminal OUT1 is pulled down to low level by the eighth transistor M8, so that the ninth transistor M9 is turned off; after the ninth transistor M9 is turned off, a path for transmitting a coupling effect of the first capacitor C1 generated when the pull-up node PU is jumped to the transmission signal output terminal OUT1 can be cut off, and thus the transmission signal VZ output by the transmission signal output terminal OUT1 is prevented from generating noises such as sharp spines and the like due to the coupling effect of the first capacitor C1, and stability of the shift transmission signal VZ of the shift register is further ensured.

Advantageous effects of Embodiments 1 to 2: in the shift register provided in Embodiments 1 to 2, by arranging the denoising module, the shift register can prevent the transmission signal output by the transmission signal output terminal of the shift register from generating noises such as sharp spines and the like due to a coupling effect of the first capacitor when the voltage of the pull-up node jumps, and thus the interstage shift transmission signal of the shift register is more stable, and meanwhile noises of the shift register circuit is further reduced, and further the signal output by the output terminal of the shift register is more stable.

Embodiment 3

Figure 9:
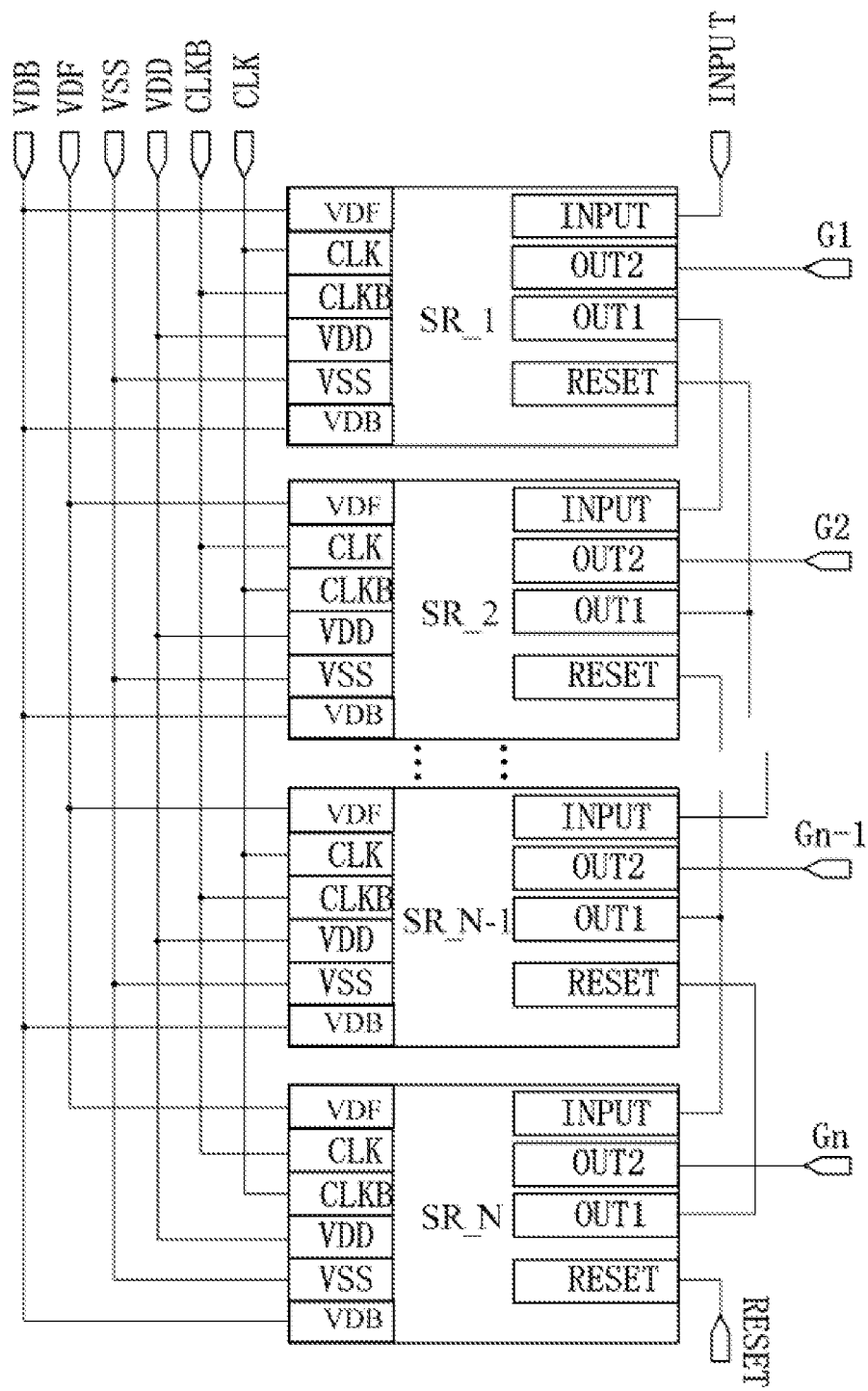
FIG. 9 is a cascading schematic diagram of a gate driving circuit in Embodiment 3 of the present disclosure.

The embodiment provides a gate driving circuit, as shown in FIG. 9, comprising: a multi-stage shift register, the shift register being the shift register in Embodiment 1 or 2, and a transmission signal output terminal OUT1 of the shift register of a present stage is connected with a reset signal input terminal RESET of the shift register of a previous stage and a start signal input terminal INPUT of the shift register of a next stage.

By using the shift register in Embodiment 1 or 2, noises of the gate driving circuit are reduced, so that a gate driving signal output by the gate driving circuit is more stable.

Embodiment 4

The embodiment provides a display device, comprising the gate driving circuit in Embodiment 3.

By using the gate driving circuit in Embodiment 3, the display device displays more stably, and thus display quality of the display device is improved.

It should be understood that the foregoing embodiments are only exemplary embodiments of the present disclosure to describe the principle of the present disclosure; however, the present disclosure is not limited thereto. Those ordinarily skilled in the art can make various changes and modifications without departing from the spirit and essence of the present disclosure, and such changes and modifications also fall into the protection scope of the present disclosure.

This application claims priority to a Chinese patent application of Application No. 201510242821.0, entitled "Shift Register and Driving Method Thereof, Gate Driving Circuit and Display Device", to the Patent Office of the People's Republic of China on May 13, 2015, all of which are incorporated herein by reference in their entireties.

The invention claimed is:

1. A shift register, comprising a pull-up module, a first capacitor and a pull-down module, wherein
the shift register further comprises a denoising module,
a first terminal of the denoising module being connected with a second terminal of the first capacitor, and a second terminal of the denoising module being connected with a transmission signal output terminal;
wherein, the pull-up module is connected with an output terminal of the shift register and the transmission signal output terminal, and connected with a first terminal of the first capacitor, and is used for pulling up a signal output by the output terminal of the shift register and a signal output by the transmission signal output terminal under control of the first terminal of the first capacitor, a connecting point between the pull-up module and the first terminal of the first capacitor being a pull-up node;
the pull-down module is connected with the output terminal of the shift register and the transmission signal output terminal, and connected with the first terminal of the first capacitor, and is used for pulling down the signal output by the output terminal of the shift register and the signal output by the transmission signal output terminal at a pull-down stage;
the denoising module is used for cutting off a connecting path between the transmission signal output terminal and the second terminal of the first capacitor at the pull-down stage,
wherein the pull-down module includes a third sub-module and a fourth sub-module, the third sub-module and the fourth sub-module being connected at a pull-down node, the third sub-module being further connected with a second clock signal terminal and the first power source, the fourth sub-module being further connected with a second power source, the output terminal, a second electrode of the ninth transistor and the transmission signal output terminal, and the fourth sub-module being connected with the first sub-module and the second sub-module at the pull-up node;
the third sub-module is used for controlling a potential of the pull-down node at the pull down stage;
the fourth sub-module is used for pulling down the signal output by the output terminal of the shift register and the signal output by the transmission signal output terminal at the pull-down stage.

2. The shift register according to claim 1, wherein, the denoising module includes a ninth transistor,
wherein a gate electrode and a first electrode of the ninth transistor are connected with the second terminal of the first capacitor, and a second electrode of the ninth transistor is connected with the transmission signal output terminal; or a first electrode of the ninth transistor is connected with the second terminal of the first capacitor, and a gate electrode and a second electrode of the ninth transistor are connected with the transmission signal output terminal.

3. The shift register according to claim 2, wherein the pull-up module includes a first sub-module and a second sub-module, the first sub-module and the second sub-module being connected at the pull-up node, the first sub-module being further connected with a first clock signal terminal and the transmission signal output terminal, and the second sub-module being further connected with a first power source and the output terminal of the shift register;
the first sub-module is used for pulling up the signal output by the transmission signal output terminal;
the second sub-module is used for pulling up the signal output by the output terminal of the shift register.

4. The shift register according to claim 2, wherein the ninth transistor is an N-type transistor, with a first electrode thereof being a drain electrode, and a second electrode thereof being a source electrode.

5. The shift register according to claim 2, wherein the ninth transistor is a P-type transistor, with a first electrode thereof being a source electrode, and a second electrode thereof being a drain electrode.

6. The shift register according to claim 1, wherein the first sub-module includes a fourth transistor, a gate electrode of the fourth transistor being connected with the pull-up node, a first electrode of the fourth transistor being connected with the first clock signal terminal, and a second electrode of the fourth transistor being connected with the transmission signal output terminal;
the second sub-module includes a third transistor, a gate electrode of the third transistor being connected with the pull-up node, a first electrode of the third transistor being connected with the first power source, and a second electrode of the third transistor being connected with the output terminal of the shift register.

7. The shift register according to claim 6, wherein the third sub-module includes a fifth transistor and a sixth transistor, a gate electrode and a first electrode of the fifth transistor being connected with the second clock signal terminal, and a second electrode of the fifth transistor being connected with a gate electrode of the sixth transistor, a first electrode of the sixth transistor being connected with the first power source and the first electrode of the third transistor, and a second electrode of the sixth transistor being connected with the pull-down node;
the fourth sub-module includes a seventh transistor, an eighth transistor, a tenth transistor and an eleventh transistor, a gate electrode of the tenth transistor and a first electrode of the seventh transistor being both connected with the pull-up node; a first electrode of the tenth transistor, a gate electrode of the seventh transistor, a gate electrode of the eighth transistor and a gate electrode of the eleventh transistor being all connected with the pull-down node; a second electrode of the tenth transistor, a second electrode of the seventh transistor, a second electrode of the eighth transistor and a second electrode of the eleventh transistor being all connected with the second power source; a first electrode of the eighth transistor being connected with the second electrode of the ninth transistor, the second electrode of the fourth transistor and the transmission signal output terminal; and a first electrode of the eleventh transistor being connected with the second electrode of the third transistor and the output terminal of the shift register.

8. The shift register according to claim 7, wherein a phase difference between a first clock signal output by the first clock signal terminal and a second clock signal output by the second clock signal terminal is 180 degrees.

9. The shift register according to claim 7, wherein the shift register further comprises a trigger reset module, for charging and discharging the pull-up node according to a start signal input by a start signal input terminal and a reset signal input by a reset signal input terminal, the trigger reset module includes a trigger sub-module and a reset sub-module, the trigger sub-module and the reset sub-module being connected at the pull-up node, the trigger sub-module being connected with a third power source, and the reset sub-module being connected with a fourth power source;

the trigger sub-module is used for charging the pull-up node according to the start signal input by the start signal input terminal;

the reset sub-module is used for discharging the pull-up node according to the reset signal input by the reset signal input terminal.

10. The shift register according to claim 9, wherein the trigger sub-module includes a first transistor, a gate electrode of the first transistor being connected with the start signal input terminal, a first electrode of the first transistor being connected with the third power source, and a second electrode of the first transistor being connected with the pull-up node;

the reset sub-module includes a second transistor, a gate electrode of the second transistor being connected with the reset signal input terminal, a first electrode of the second transistor being connected with the pull-up node, and a second electrode of the second transistor being connected with the fourth power source.

11. The shift register according to claim 10, wherein the first to eighth transistors and the tenth and eleventh transistors are N-type transistors, with first electrodes thereof being drain electrodes, and second electrodes thereof being source electrodes.

12. A gate driving circuit, comprising: a multi-stage shift register, wherein the shift register is the shift register according to claim 1, a transmission signal output terminal of the shift register of a present stage being connected with a reset signal input terminal of the shift register of a previous stage and a start signal input terminal of the shift register of a next stage.

13. A driving method of the shift register according to claim 1, characterized in that, the driving method comprises:

a first stage: the first capacitor being charged, the pull-up module pulls up a signal output by an output terminal of the shift register under control of the pull-up node;

a second stage: the first capacitor raising a voltage of the pull-up node at the stage, the pull-up module continuously pulls up the signal output by the output terminal of the shift register, and the pull-up module pulls up a signal output by a transmission signal output terminal;

a third stage: the first capacitor being discharged, the pull-up module pulls down the signal output by the output terminal of the shift register mid the signal output by the transmission signal output terminal, and the denoising module cuts off a connecting path between the transmission signal output terminal and the second terminal of the first capacitor.

* * * * *